CONVERTER WITH INDUCTANCE MEANS FOR SWEEPING
CHARGE CARRIERS FROM BASE REGION
Filed May 1, 1959
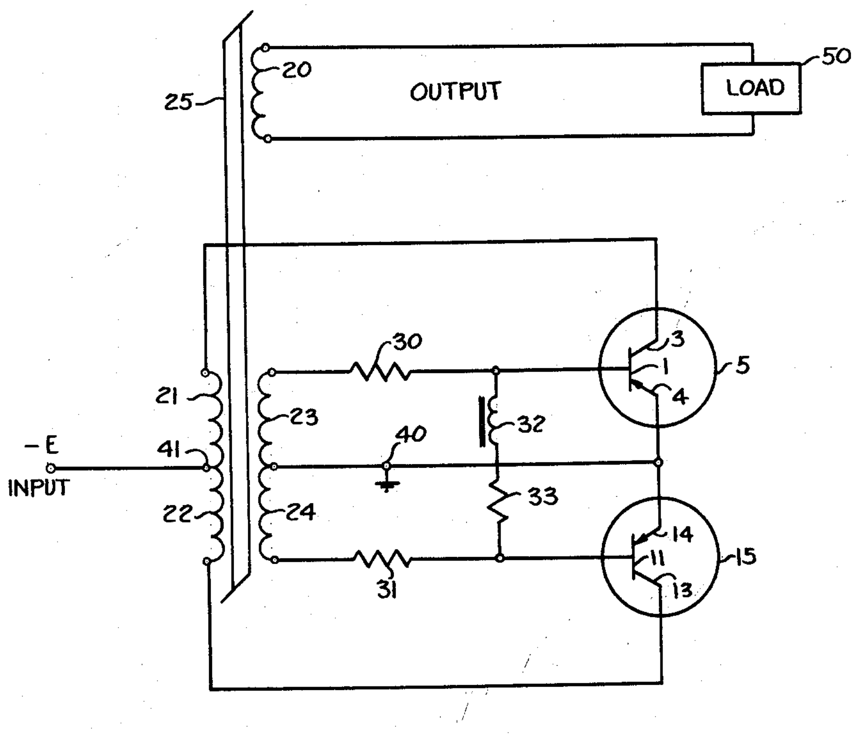
*INVENTOR.*
A.J. RADCLIFFE, JR.
BY J. Warren Whitesel
ATTORNEY United States Patent Office 3,081,437 Patented Mar. 12, 1963

3,081,437

CONVERTER WITH INDUCTANCE MEANS FOR SWEEPING CHARGE CARRIERS FROM BASE REGION

Arthur J. Radcliffe, Jr., La Grange, Ill., assignor to International Telephone and Telegraph Corporation, New York, N.Y., a corporation of Maryland Filed May 1, 1959, Ser. No. 810,328
9 Claims. (Cl. 331—113)

This invention relates to semi-conductor switching circuits and more particularly to high frequency converters.

In the past, when an attempt was made to utilize semi-conductors in high frequency switching applications, such as in connection with magnetic amplifier power sources, it was found that hole storage in the base region of the semi-conductor resulted in an effective short circuit between base and collector electrodes during the "off-going" transitions. The result was an increase in the switching time and, therefore, a theoretical limitation on the upper frequency of switching. In addition to the increased switching time, it was found that power dissipation problems become excessive when a semi-conductor circuit is subjected to 10,000 transitions per second and over. Therefore, it is necessary to remove the stored holes during each "off-going" transition to prevent the effective short circuit and to eliminate the power dissipation problems.

It has been common practice to connect capacitors to base electrodes to provide a low impedance path during the capacitor's charging time in order that the charging current may sweep offending stored holes from the base region during "off-going" transitions. The difficulty is that such capacitors are bulky, expensive items and that high peak, base currents tend to limit the usefulness of components, such as magnetic amplifiers which otherwise might be used in high frequency D.C. to A.C. converting circuits.

An object of this invention is to provide a new and improved high frequency semi-conductor switching circuit.

Another object of this invention is to sweep holes from the base region of semi-conductors during "off-going" transitions.

Yet another object of this invention is to provide transistorized D.C. to A.C. converters using magnetic amplifier circuits.

In accordance with this invention an inductance is connected to base electrodes to provide a lag current that sweeps away an accumulation of holes from a semi-conductor. The particular embodiment of the invention that is shown in the drawing includes a magnetic amplifier comprising a power oscillator using the volt-second timing properties of a square hysteresis loop magnetic core to establish a running frequency whereby a relatively low voltage direct current may be converted into alternating current or pulsating direct current.

More particularly, two semi-conductors such as transistors, for example, are connected to conduct alternately, i.e. one semi-conductor conducts only during first half-cycle oscillations and the other semi-conductor conducts only during second half-cycle oscillations. An inductance is connected between the base electrodes of the semi-conductors to provide a current lag during each "off-going"

transition in order to sweep accumulated holes from the base region of the semi-conductive material.

The above mentioned and other objects of this invention together with the manner of obtaining them will become more apparent and the invention itself will be best understood by making reference to the following description of an embodiment of the invention taken in conjunction with the accompanying single sheet of drawings which shows a D.C. to A.C. converter.

Where possible, simple terms are used and specific items are described hereinafter to facilitate an understanding of the invention; however, it should be understood that the use of such terms and references to such items are not to act in any manner as a disclaimer of the full range of equivalents which is normally given under established rules of patent law.

Briefly, the drawing shows a D.C. to A.C. converter including a transformer having windings 20–24 of which: items 21 and 22 comprise an input winding, items 23 and 24 comprise a feedback winding to cause oscillation, and item 20 comprises an output winding that delivers alternating current to load 50. The windings are associated with a magnetic core 25 having a square hysteresis loop. A direct current input potential —E, is applied through terminal 41 (which is a center tap between input windings 21 and 22) to the input electrodes 3 and 13 of electron discharge devices 5 and 15, respectively. Although electron discharge devices 5 and 15 are illustrated as P-N-P type transistors, it should be understood that other types of semi-conductors may be used also. The base electrodes 1 and 11 are connected to the outer ends of feedback winding 23—24, respectively. Resistors 30 and 31 limit the current flow to the base electrodes, thus equalizing the effects on both transistors. Emitter electrodes 4 and 14 are connected to common ground point 40 and to a center tap in feedback winding 23—24. Inductance 32 is connected between base electrodes 1 and 11 to provide a current lag during "off-going" transitions for sweeping charge carriers from the base areas while resistance 33 is provided to limit the current through such inductance.

*Circuit Description*

The circuit is turned "on" by means of a negative signal "—E" which is applied to terminal 41. Although the circuit is shown as being balanced, it is known that no circuit of this type is completely balanced; therefore, there will be a small potential difference which will cause one of the transistors to begin to conduct. For the purposes of this description, it is assumed that transistor 5 is conducting; therefore, current flows from input 41 through winding 21, collector 3, and emitter 4 to ground 40. Responsive to such current, a signal is induced by transformer action from winding 21 to windings 20, 23 and 24. The signal that is induced in winding 24 biases base electrode 11 in a positive direction, thus cutting-off transistor 15 and the signal that is induced in winding 23 biases transistor 5 in a negative direction, thus increasing the current flow through winding 21 and transistor 5. Finally transistor 5 reaches saturation and offers virtually no resistance to current flow at which time transistor 15 offers its greatest resistance to current flow.

As current increases through transistor 5, core 25 is biased toward saturation. Eventually the core reaches a point where further magnetic saturation is not possible; whereupon, core 25 snaps to its second state of saturation. Thereafter, the inductive effect across the transformer including core 25 is negligible and bias is removed from base electrode 1, thus cutting-off the flow of current through transistor 5.

Just prior to cut-off, signals induced by transformer action cause current to flow in a circuit which may be traced from winding 24 through resistor 31, resistor 33, inductance 32, resistor 30, and winding 23. At the time of cut-off, positive current flows upward through inductance 32 and after cut-off there is a lag caused by the inductive effects of the inductance 32 which removes the offending holes from base 1. The steady state current in inductance 32 is determined by selection of proper values for resistors 30, 31, and 33.

After transistor 5 cuts-off the flux in winding 21 begins to decay, thereby inducing a small current in windings 23 and 24 in a direction that is opposite to the direction in which current flowed while transistor 5 was conducting. Current induced by decaying flux, therefore, biases transistor 5 in the direction of its cut-off and biases transistor 15 toward conduction. A small current begins to flow over a circuit which may be traced from ground at point 40 through emitter 14, base 11, collector 13, winding 22, and point 41 to the source of input signal —E. Responsive to such current, a signal is induced by transformer action from winding 22 through core 25 to windings 23 and 24. The current which is induced in winding 24 biases base 11 further in the direction of conductivity and biases base 1 further in the direction of cut-off.

Current flows through transistor 15 until core 25 is snapped to the magnetic state of saturation which is opposite to that produced when transistor 5 was conducting. When the core is snapped, signals induced across core 25 terminate and transistor 15 is cut-off. Once again, current flowing through inductance 32 continues momentarily after cut-off, thereby providing a lag current which sweeps the collection of offending holes from base electrode 11.

Each time that current flows through windings 21 and 22, an output signal is induced in winding 20. Thus, it is seen that an alternating current output is delivered to load 50 responsive to a direct current input at point 41. The wave form of the alternating current output is determined by the time required for core 25 to saturate. Since core 25 is assumed to have a substantially square hysteresis loop, the alternating current output is a series of substantially square waves.

As pointed out above simple terms have been used and specific items have been described to facilitate an understanding of the invention. For example, the drawing shows a circuit using P-N-P transistors having problems which center about an accumulation of holes during offgoing transitions. As also pointed out above, the invention is equally applicable to any form of semi-conductor, such as an N-P-N transistor where similar problems center about an accumulation of electrons. Thus, it should be understood that the principles described above are equally applicable to any device having an offensive accumulation of charge carriers, and further that the term "holes" as used herein is intended to cover all such charge carriers.

Therefore, while the invention has been described in connection with specific apparatus, it is to be clearly understood that this description is made only by way of example and not as a limitation on the scope of the invention.

I claim:

1. A power supply comprising a pair of semi-conductors each of which includes at least a base electrode, a substantially square hysteresis loop core having windings thereon, means including said windings for cyclically biasing a first of said semi-conductors to a conducting state and for biasing the other of said semi-conductors to a non-conducting state during first half cycles while core flux is being driven to saturation in a first magnetic direction, means including said windings for cyclically biasing said first semi-conductor to a non-conducting state and said other semi-conductor to a conducting state during second half cycles while core flux is being driven to saturation in an opposite direction, and inductance means connected between said base electrodes to provide lag current each time that one of said semi-conductors is cut-off, for sweeping charge carriers from said base region.

2. The power supply of claim 1 wherein said semi-conductors are transistors.

3. In an electrical system, two semi-conducting devices each having at least a base electrode, control means for producing biasing potential of periodically reversing polarity, means responsive to one polarity of said biasing potential for causing one of said semi-conducting devices to conduct and for causing the other of said semi-conducting devices to cut-off, means responsive to reverse polarity of said biasing potential for causing said one semi-conducting device to cut-off and for causing said other semi-conducting device to conduct, and inductance means connected between said base electrodes for momentarily applying a charge carrier storage neutralizing current through said base electrodes each time that the semi-conducting device associated with said base electrode is cut-off.

4. In an electrical system, two transistors each having at least a base electrode, said transistors being subject to an accumulation of charge carriers on cut-off, a magnetic device comprising a core member having a substantially square hysteresis loop, a plurality of windings associated with said magnetic device, means for connecting said magnetic device and said windings to produce biasing potential of periodically reversing polarity, means responsive to one polarity of said biasing potential for causing one of said transistors to conduct and for causing the other of said transistors to cut-off, means responsive to reverse polarity of said biasing potential for causing said one transistor to cut-off and for causing said other transistor to conduct, and inductance means for momentarily maintaining a current flow from said base electrode after cut-off to remove said accumulation of charge carriers.

5. In an electrical system, two semi-conductors each having at least a base electrode, and a collector electrode, said semi-conductors being subject to an accumulation of charge carriers when current through said semi-conductors is cut-off, a magnetic device comprising a core member having substantially a square hysteresis loop, a plurality of windings associated with said core, means for connecting a first of said windings between said collector electrodes, means for connecting a second of said windings between said base electrodes, and means including an inductance interconnecting said base electrodes for providing a current flow from said base electrodes after cut-off to remove said accumulated charge carriers.

6. The electrical system of claim 5 and means for limiting current flow through said induction means in accordance with electrical characteristics of said accumulation of charge carriers.

7. A D.C. to A.C. converter comprising a magnetic core device having a substantially square hysteresis loop and having at least two windings associated therewith, two transistors each having at least base, emitter, and collector electrodes, means for connecting one end of a first of said windings to one of said collectors, means for connecting the other end of said first winding to the other of said collectors, means for connecting a first end of the other of said windings to one of said base electrodes and for connecting the other end of said other winding to the other of said base electrodes, a control potential having two polarities, means for applying a first of said polarities to the center of said first winding, means for applying the second of said polarities to said emitter electrodes and to the center of said other winding, and means including an inductance interconnecting said base electrodes for maintaining current flow after said transistors cut-off for reducing storage time by sweeping offending charge carriers from said transistors.

8. The converter of claim 7, and a third winding associated with said core device, and means for connecting said third winding to provide an A.C. output.

9. The converter of claim 8 and means for limiting current flow through said inductance means in accordance with electrical cut-off characteristics of said transistors.

References Cited in the file of this patent

UNITED STATES PATENTS

| | | |
|---|---|---|
| 2,620,448 | Wallace | Dec. 2, 1952 |
| 2,647,958 | Barney | Aug. 4, 1953 |
| 2,759,104 | Skellett | Aug. 14, 1956 |
| 2,843,762 | Trent | July 15, 1958 |
| 2,849,673 | Hubbard | Aug. 26, 1958 |
| 2,892,102 | Reuther et al. | June 23, 1959 |
| 2,943,212 | Hill et al. | June 12, 1960 |